United States Patent [19]
Feilchenfeld et al.

[11] Patent Number: 4,883,744
[45] Date of Patent: Nov. 28, 1989

[54] FORMING A POLYIMIDE PATTERN ON A SUBSTRATE

[75] Inventors: Natalie B. Feilchenfeld; Stephen J. Fuerniss, both of Endicott; John J. Glenning, Vestal; Walter P. Pawlowski; Giana M. Phelan, both of Endicott; Paul G. Rickerl, Endicott, all of N.Y.

[73] Assignee: International Business Machines Corporation, Armonk, N.Y.

[21] Appl. No.: 196,641

[22] Filed: May 17, 1988

[51] Int. Cl.$^4$ .............................................. G03C 5/16
[52] U.S. Cl. .................................. 430/325; 430/327; 430/330; 430/331
[58] Field of Search ............... 430/325, 327, 330, 331, 430/195, 197, 283, 287

[56] References Cited

U.S. PATENT DOCUMENTS

| | | | |
|---|---|---|---|
| 4,243,743 | 1/1981 | Hiramoto et al. | 430/281 |
| 4,287,297 | 9/1981 | Ishihara et al. | 430/435 |
| 4,353,778 | 10/1982 | Fineman et al. | 156/644 |
| 4,369,090 | 1/1983 | Wilson et al. | 156/644 |
| 4,411,983 | 10/1983 | Washizawa et al. | 430/325 |
| 4,431,478 | 2/1984 | Yamaoka et al. | 156/668 |
| 4,547,455 | 10/1985 | Hiramoto et al. | 430/325 |
| 4,576,892 | 3/1986 | Golda et al. | 430/157 |
| 4,578,328 | 3/1986 | Kray | 430/18 |
| 4,587,197 | 5/1986 | Kojima et al. | 430/196 |
| 4,624,740 | 11/1986 | Abrams et al. | 156/643 |
| 4,639,290 | 1/1987 | Leyden et al. | 156/644 |
| 4,661,435 | 4/1987 | Minnema et al. | 430/311 |

OTHER PUBLICATIONS

Saunders et al., "Photosensitive Polyimide Coatings", IBM Technical Disclosure Bulletin, vol. 16, No. 2, Jul. 1973, pp. 601–602.

Primary Examiner—Jose G. Dees
Attorney, Agent, or Firm—Pollock, Vande Sande & Priddy

[57] ABSTRACT

A polyimide pattern is formed on a substrate by providing a layer of photosensitive polyimide precursor containing the polyimide precursor and a compound having a photosensitive group on the substrate and prebaking the layer. The layer is then exposed imagewise to actinic radiation through a photomask to form an exposed image pattern of the polyimide precursor in the layer. The unexposed areas of the layer are removed using a liquid developer and the exposed image pattern is cured by heating. In one aspect of the present invention, the prebaking step employs a judicious selection of times and temperature to eliminate the problem of formation of a white residue that occurs from using prior art prebake procedures. In another aspect of the present invention, a particular liquid developer composition is employed to facilitate the formation of sloped vias in the polyimide. In another aspect of the present invention, a particular range of exposure wavelength(s) is employed to obtain smooth walled vias.

21 Claims, No Drawings

FORMING A POLYIMIDE PATTERN ON A SUBSTRATE

DESCRIPTION

1. Technical Field

The present invention is concerned with forming polyimide patterns on a substrate and is especially concerned with forming polyimide patterns from a layer of a photosensitive polyimide precursor. The present invention is especially suitable for forming vias in polyimide layers that separate metallic layers from each other to allow for selective metal connection between the separated metallic layers.

2. Background Art

Polyimides are commonly employed in the semiconductor and packaging industry. For instance, in the packaging of semiconductor chips, polyimide films are often coated onto substrates. In a number of these situations it is necessary to form vias in the polyimide layers to allow for electrical connections to be made between different layers of metallurgy.

For instance, in the formation of multilayer substrates for mounting chips, one configuration employs an insulating substrate of a ceramic material onto which is deposited a pattern of metallic conductors. Usually, the conductors are three layers of metal being a layer of chromium, followed by a layer of copper, followed by an overlying layer of chromium. On top of the metallized ceramic substrate is placed a layer or film of a polyimide and on top of the polyimide a second layer of a pattern of conductors is provided.

It is necessary to electrically connect some of the conductors in the upper or second layer of metallization to some of the conductors in the lower or first layer of metallization. In order to do so, the polyimide must be etched to form desired vias therein to allow for a metal connection between the upper and lower layers of the metallization with the pattern of the polyimide being very accurate and of high quality.

Moreover, recent advances in VLSI devices require increased performance from electronic packages. Greater wiring density and smaller signal propagation delay are required to support the high-speed logic chips. Multilayer interconnection technology is an important key to microelectronic packaging. As the volume for multilayer ceramic packages increases, improved methods for manufacturing the substrates have become increasingly important.

For instance, the use of layers of photosensitive polyimide precursors in place of standard polyimides has been suggested, particularly since the procedure employed for the photosensitive layers eliminates a number of steps required when conventional polyimide precursor layers are employed.

It has been observed, however, that when using layers of photosensitive polyimide precursors for applications that require relatively thick films, such as final cure thicknesses of at least about 5 micrometers or more, that the prebaking procedure results in the formation of a white residue on the polyimide type layer. Accordingly, elimination of the formation of white residue would be beneficial. Furthermore, for certain uses of the polyimides and particularly as insulators between different metallized layers on a substrate, it is desirable that the vias exhibit a sidewall profile that is less than about 70° from the horizontal. However, the developing solutions presently employed result in sidewall profiles that approach the vertical and are greater than 70°. In addition, the exposure conditions presently employed result in vias with an overhang lip at the top of the via. The problem with an overhang and with sidewall profiles that are 70° or greater is that the top metal layers which are sputtered on tend to be too thin along the wall of the via due to line-of-sight nature of sputtering (shadow effect which inhibits metal deposition) and during on/off cycling (thermal expansion and contraction) the metal tends to crack, thereby significantly reducing the reliability and life of the vias. Accordingly, it would be desirable to control the via size and wall profile thereof.

SUMMARY OF INVENTION

The present invention is concerned with forming polyimide patterns on a substrate and particularly from a layer of photosensitive polyimide precursor.

According to one aspect of the present invention, the method eliminates the formation of white residue on the polyimide layer due to the prebaking procedure that has especially plagued those employing increased thicknesses of the polyimide. In particular, this aspect of the present invention includes providing on the substrate a layer of photosensitive polyimide precursor that includes a polyimide precursor and a compound having a photosensitive group. The layer of photosensitive polyimide precursor is prebaked by ramping up the temperature of the oven to about 90° C. and maintaining at that temperature for up to about 2 minutes, then ramping down to a temperature of the oven of about 80° C., and maintaining about 80° C. for about 90 to about 150 minutes, and then cooling down to at least about 60° C. or lower. The layer is then exposed imagewise to actinic radiation through a photomask to form an exposed image pattern of polyimide precursor in the layer. The unexposed areas of the layer are removed with a liquid developer and the exposed image pattern of the polyimide precursor is cured by heating.

The particular time/temperature profile is essential in eliminating the problem of white residue formation. The various temperature and time conditions are crucial since applying too little thermal energy to the film results in the formation of the white residue, while applying too much thermal energy, such as heating for too long a period of time or raising the prebake temperature to too high a level, will result in destruction of the photosensitive material and the polyamic acid (polyimide precursor) will imidize and form the polyimide prematurely in the process. If this occurs, it will not be possible to form the necessary vias since this material cannot be removed by the developer solution.

According to another aspect of the present invention, the exposure of the film is such as to eliminate the overhang lip at the top of the vias. In particular, smooth sidewall profiles are obtained. The exposure wavelength is preferably 405 to 436 nm and a dose of about 150–350 mJ/Cm$^2$ measured at the wavelength(s) of irradiation used. The exposed image is then developed.

According to another aspect of the present invention, the developing is such that sloped wall vias are obtained. In particular, this aspect of the present invention makes it possible to obtain sidewall profiles that are less than 70° from the horizontal. In particular, this aspect of the present invention is concerned with forming a polyimide pattern on a substrate by providing on the substrate a layer of photosensitive polyimide precursor which includes a polyimide precursor and a compound having a photosensitive group. The layer of photosensitive polyimide precursor is prebaked and exposed imagewise to actinic radiation through a photomask to form an exposed image pattern of polyimide precursor in the layer. The unexposed portions of the layer are removed with a liquid developer to provide the sloped sidewall profiles.

The liquid developer contains about 50% to about 75% by volume of N-methyl-2-pyrrolidone, about 5% to about 10% by volume of water, about 1% to about 4% by volume of isopropyl alcohol, and about 15% to about 40% by volume of methyl alcohol. The exposed image pattern of the polyimide precursor is then cured by heating.

BEST AND VARIOUS MODES FOR CARRYING OUT INVENTION

The process of the present invention is concerned with forming a polyimide pattern on a substrate by providing on the substrate a layer of photosensitive polyimide precursor that comprises a polyimide precursor and a compound having a photosensitive group. Photosensitive polyimide precursor compositions are known, as exemplified by U.S. Pat. No. 4,243,743 to Hiramoto, et al. and U.S. Pat. No. 4,547,455 to Hiramoto, et al.

The photosensitive polyimide precursor used can be given the sensitivity to the actinic radiation such as ultraviolet rays, far ultraviolet rays, and visible rays by introducing an organic photosensitive group into the polyimide precursor, for instance the side chain thereof, or by mixing a photosensitive compound with the polyimide precursor. Such photosensitive polyimide precursors are known in the art.

The polyimide precursor is also known in the conventional process of forming the polyimide pattern which is convertible to the polyimide by heating or thermally curing. The typical example of the polyimide precursor is polyamic acid. By the heat-treatment the imide rings are formed in the polymer. The typical heat-treatment is carried out at 135° C., 200° C., 350° C., and 400° C. and continued for 30 minutes in each temperature.

The photosensitive group includes those which are dimerized or polymerized by the light to form crosslinkages between the polyimide precursors, those which are activated to radicals or ions by the light, by which radicals or ions the polyimide precursors being crosslinked therebetween, and those which are activated by the light and reacted with the polyimide precursors to reduce the solubility thereof. As such a photosensitive group, a group having carbon-carbon double bond which is dimerizable or polymerizable by the light, an azide group and a quinone diazide group are exemplified.

The photosensitive compound which can be mixed with the polyimide precursor has the photosensitive group mentioned above. As such a photosensitive compound, vinyl compounds having an amino group, bisazide compounds and naphthoquinone diazide compounds are exemplified.

The following are typical examples of the photosensitive polyimide precursor.

(i) A mixture of a polyimide precursor represented by the formula (II) and a compound having the photosensitive group and amino group;

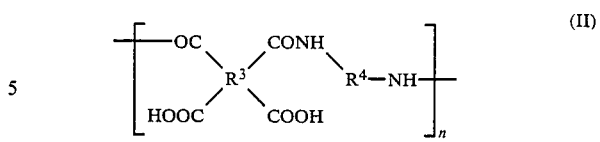

wherein n is an integer and $R_3$ and $R_4$ are tetravalent and bivalent aromatic group, respectively.

The photosensitive group herein mentioned is the same as defined above. Examples of compounds having the photosensitive group and amino group are, allylamine, vinylpyridine, dimethylaminoethyl methacrylate, diethylaminoethyl methacrylate, dimethylaminoethyl acrylate, diethylaminoethyl acrylate, diallylamine, compounds having an azide group and amino group, and compounds having diazide group and amino group.

The group $R_3$ in the formula (II) includes, for instance, a phenyl, benzophenonyl, naphthyl, and biphenyl group. The group $R_4$ includes, for instance, phenoxyphenyl, phenylsulfonylphenyl, benzylphenyl, and phenyl group.

(ii) A polyimide precursor represented by the formula (III);

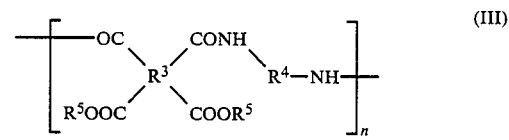

wherein $R^3$, $R^4$, and n are defined as above, respectively, and $R^5$ is an organic group having a functional group dimerizable or polymerizable by the light.

The group $R^5$ includes, for instance, allyl group, methallyl group, and various acyloylalkylenyl groups represented by the following formulas:

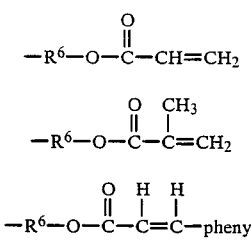

wherein $R^6$ is bivalent alkylene group of 2 or 3 carbon atoms.

(iii) A polyimide precursor represented by the formula (IV);

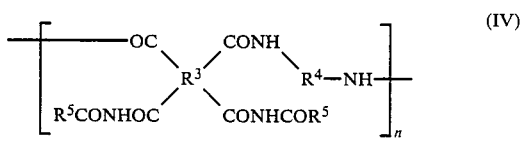

wherein $R^3$, $R^4$, $R^5$, and n are defined as above, respectively.

(iv) A mixture of the polyimide precursor represented by the formula (II) and bis-azide.

(v) A mixture of the polyimide precursor represented by the formula (II) and naphthoquinone diazide.

According to the present invention, the mixture of the polyimide represented by the formula (II) and a compound having the photosensitive group and amino group, which is belonging to type (i), is the most conventional used.

The photosensitive layer may contain one or more photosensitizers such as Michler's ketone, benzoin ether, 2-t-butyl-9,10-anthraquinone, 4,4'-bis(diethylamino)benzophenone, bis-azide compound, monoazide compound, and sulfonazide compound. Further, the photosensitive polyimide precursor may contain a comonomer which is copolymerizable to the polyimide or the precursor thereof.

The photosensitive polyimide precursor compositions are usually applied to the substrate in a form of a solution after being dissolved in a suitable solvent. Conventional solvents include N-methyl-2-pyrrolidone, N,N-dimethylacetamide, γ-butyrolactone, N,N-dimethylformamide, and preferably N-methyl-2-pyrrolidone.

Some commercially available solutions of photosensitive polyimide precursor compositions are Probimide ™ 348 Photoimageable Polyimide available from Ciba-Geigy Corporation; PI-2701D Photosensitive Polyimide, available from E. I. DuPont de Nemours and Company, Inc.; Selectilux® HTR3 Polyimide Precursor Photoresist, available from E. M. Industries, Inc.; PL-1100 Photoreactive Polyimide Precursor, available from Hitachi Chemical Company, Ltd.; and preferably Photoneece UR-3640 Photosensitive Polyimide Precursor, available from Toray Industries, Inc.

The photosensitive polyimide precursor composition is coated onto the desired substrate, such as a metallized ceramic substrate, and cured to about 40%–60% of initial thickness. When used as the insulator between two layers of metallization, the final thickness is usually about 5 to about 20 and preferably about 8 to about 10 micrometers. The composition is normally spray applied onto the substrate and has a viscosity of about 10 to about 16 poise as it is coated.

The layer of the photosensitive polyimide precursor is then prebaked in order to remove the solvent and dry the coating since the most common solvents employed are N-methyl-2-pyrrolidone and γ-butyrolactone which are sometimes referred to as "slow" solvents or "high boilers" because of their relatively low vapor pressures and are extremely difficult to evaporate. Accordingly, one problem that has existed with respect to removing such solvents and especially the N-methyl-2-pyrrolidone has been the occurrence of a white residue on the polyimide precursor.

With respect to that aspect of the present invention concerned with overcoming this problem, the prebaking procedure involves a judicious selection of temperature/time profile that results in removal of the solvent without imidizing the polyamic acid and/or destroying the photoinitiator. In particular, the prebaking, with respect to this aspect of the present invention, involves placing the layer in an oven and ramping up the temperature of the oven to about 90° C., preferably at a rate of about 6° C./minute and maintaining at that temperature for up to about 2 minutes and preferably about 15 seconds to about 2 minutes. Also, it is preferred that prior to the ramping up of the temperature to about 90° C., the oven is at about 60° C. for about 10 minutes. Then the temperature is ramped down to about 80° C., preferably at a rate of about 1° C./minute and maintained at about 80° C. for about 90 to about 150 minutes; afterwhich, it is cooled down to at least about 60° C. and preferably cooled down at a rate of about 2 to about 4° C./minute. In particular, the faster the cooling down to the 60° C., the better.

By following this particular prebake profile, the problem with respect to formation of white residue is eliminated.

After the prebaking, the layer is exposed imagewise to actinic radiation through a photomask to form an exposed image pattern of polyimide precursor in the layer.

The actinic radiation can, for example, be provided by employing a high pressure mercury lamp which has optics that have been optimized for a single wavelength. The commonly used wavelengths are 365 nm to 436 nm, preferably 405 nm to 436 nm, including 365 nm, 405 nm, and 436 nm. The most preferred wavelength employed pursuant to the present invention is 436 nm. The exposure energies employed in accordance with the present invention are usually about 150 mj/cm$^2$ to about 350 mj/cm$^2$ as measured at the wavelength(s) of irradiation. The preferred exposure energies employed are about 250 to 350 mj/cm$^2$.

The use of the preferred exposure conditions provide for exposing the polyimide more uniformly throughout the film thickness to provide the sloped wall vias. This is so despite the relatively low transmission of light through the film.

After the exposure through a photomask, the mask is removed and the exposed photosensitive layer is developed.

Examples of photomasks include chromium mask bearing an image pattern of chromium or chromium oxide on a glass or an emulsion mask bearing the image pattern of photographic emulsion on the glass or a transparent film.

With respect to those aspects of the present invention where it is desired to provide sidewall profiles of the vias that are less than 70° from the horizontal and preferably about 45° from the horizontal, a developing solution, as discussed below, must be employed. Sidewall profiles less than 70° from the horizontal are desired when employing relatively thick polyimide layers that are used to insulate two metallization layers from each other. In particular, if the wall profile is greater than 70°, the second metallization layers that are sputtered on will be too thin along the wall of the vias and during on/off cycling (thermal expansion and contraction), the metal will tend to crack, thereby significantly decreasing the reliability and life of the vias.

It has been found, pursuant to the present invention, that the sloped wall vias of the type desired can be obtained by employing a solvent solution that contains about 50% to about 75% by volume of N-methyl-2-pyrrolidone, about 5% to about 10% by volume of water, about 1% to about 4% by volume of isopropyl alcohol, and about 15% to about 40% by volume of methyl alcohol. A typical example of a developing solution within the context of the present invention contains about 62.3% by volume of N-methyl-2-pyrrolidone, about 8.9% by volume of water, about 2.7% by volume of isopropyl alcohol, and about 26.1% by volume of methyl alcohol.

The relative amounts of these materials are crucial to obtaining the desired result. For instance, if greater than about 10% by volume of water is employed, an undesirable side reaction occurs, thereby producing white residue. In addition, if greater than about 4% by volume of isopropyl alcohol is employed, the developer will not adequately form the necessary vias. The isopropyl alcohol tends to decrease the penetration of the developer solution, but at the same time, decreasing the reaction rate. Accordingly, it was necessary to employ the water in order to provide a sufficient developing rate.

The temperature of the developing is usually from about 20° C. to about 30° C. controlled to ±1° C. Also, the developing mixture results in reduced edge attack of the film. Edge attack is when the polyimide is stripped off along an area that is laterally exposed to the developer composition. Furthermore, the use of the developer compositions employed pursuant to the present invention provide more consistent via sizes than previously experienced. For instance, deviations of only about 0.13 mils over the bottom diameter and standard deviation of the top diameter of less than the bottom diameter of 0.08 mils has been observed.

After developing, the exposed image pattern of the polyimide precursor in the layer is cured by convection heating, such as at temperatures of about 350° C. to about 400° C. for about 30 to about 90 minutes. Normally, the crosslinked photosensitive polyimide precursor is heated to about 350° C. to about 400° C. for at least about 30 minutes in a convection oven under a nitrogen atmosphere for final curing.

The following non-limiting example is presented to further illustrate the present invention:

EXAMPLE

Toray UR-3640 photosensitive polyimide is spray applied onto a ceramic base with a chromium-copper-chromium metallurgy imaged into a circuit pattern by photolithographic operations. This photosensitive polyimide is spray applied to an initial thickness of 25 microns. The parts are then subjected to a 60° C. bake for about 10 minutes followed by a ramp up to about 90° C. at a rate of 6° C. per minute. The temperature is then ramped down to about 80° C. at a rate of about 1° C. per minute. The parts remain at this temperature for about 2 hours. The temperature in the oven is then cooled down to about 60° C. and the parts are then removed.

The parts are then exposed with a pattern at 405 nanometers (wavelength of light) with an exposure energy of 250 millijoules per square centimeter.

The image exposed is then developed in a developer solution containing about 60% N-Methyl-2-Pyrrolidone, about 5% water, about 3% isopropyl alcohol with the balance methyl alcohol (% is by volume) at 30° C. for 6 minutes with ultrasonic agitation and movement of the parts (to prevent a standing wave effect). The parts are then rinsed in isopropyl alcohol at room temperature for about 10 minutes and then air dried.

The parts are then subjected to about 350° C. for about 30 minutes to complete the cure and harden the image.

Having thus described our invention, what we claim as new and desire to secure by Letters Patent is:

1. A process of forming a polyimide pattern on a substrate which comprises:
    (a) providing on the substrate a layer of photosensitive polyimide precursor comprising a polyimide precursor and a compound having a photosensitive group;
    (b) prebaking the layer of photosensitive polyimide precursor by placing the layer in an oven and ramping up the temperature of the oven to about 90° C. and maintaining at about 90° C. for up to about 2 minutes, then ramping down to about 80° C. and maintaining about 80° C. for about 90 minutes to 150 minutes and cooling down to at least about 60° C.;
    (c) exposing said layer imagewise to actinic radiation through a photomask to form an exposed image pattern of polyimide precursor in the layer;
    (d) removing unexposed areas of the layer with a liquid developer; and
    (e) curing the exposed image pattern of the polyimide precursor in the layer by heating.

2. The process of claim 1 wherein said liquid developer contains about 50–75% by volume of N-methyl-2-pyrrolidone; about 5–10% by volume of water; about 1–4% by volume of isopropyl alcohol; and about 15–40% by volume of methyl alcohol.

3. The process of claim 1 wherein the polyimide precursor composition is applied as a solution in N-methyl-2-pyrrolidone.

4. The process of claim 1 wherein the solution has a viscosity of about 10 to about 16 poise.

5. The process of claim 1 wherein the final thickness of the layer of photosensitive polyimide is about 5 to about 20 micrometers.

6. The process of claim 1 wherein the final thickness of the layer of photosensitive polyimide is about 8 to about 10 micrometers.

7. The process of claim 1 wherein said layer is cooled down to at least about 60° C. at a rate of about 2 to about 4° C./minute.

8. The process of claim 1 wherein the temperature is maintained at about 90° C. for about 15 seconds to about 2 minutes.

9. The process of claim 8 wherein the oven is at a temperature of about 60° C. for about 10 minutes prior to the ramping up to about 90° C. and wherein said ramping is at a rate of about 6° C./minute.

10. The process of claim 9 wherein the ramping down to about 80° C. is at a rate of about 1° C./minute.

11. The process of claim 10 wherein the layer is cooled down to at least about 60° C. at a rate of about ° C./minute to about 4° C./minute.

12. The process of claim 1 wherein said layer is exposed to actinic radiation having a wavelength of 365 nm to 436 nm at an energy level of about 150 to about 350 mj/cm2.

13. The process of claim 12 wherein said radiation is 436 nm and said energy level is about 250 to about 350 mj/cm2.

14. A process of forming a polyimide pattern on a substrate wherein the pattern includes sloped wall vias with sidewall profile of less than 70° from the horizontal which comprises:
    (a) providing on the substrate a layer of photosensitive polyimide precursor comprising a polyimide precursor and a compound having a photosensitive group;
    (b) prebaking the layer of photosensitive polyimide precursor;
    (c) exposing said layer imagewise to actinic radiation through a photomask to form an exposed image pattern of polyimide precursor in the layer;
    (d) removing unexposed areas of the layer with a liquid developer containing about 50–75% by volume of N-methyl-2-pyrrolidone; about 5–10% by volume of water; about 1–4% by volume of methyl alcohol; and (e) curing the exposed image pattern of the polyimide precursor in the layer by heating.

15. The process of claim 14 wherein the final thickness of the layer of photosensitive polyimide is about 5 to about 20 micrometers.

16. The process of claim 14 wherein the final thickness of the layer of photosensitive polyimide is about 8 to about 10 micrometers.

17. The process of claim 14 wherein the polyimide precursor composition is applied as a solution in N-methyl-2-pyrrolidone.

18. The process of claim 17 wherein the solution has a viscosity of about 10 to about 16 poise.

19. The process of claim 14 wherein said developer contains about 62.3% by volume of N-methyl-2pyrrolidone; about 8.9% by volume of water; about 2.7% by volume of isopropyl alcohol; and about 26.1% by volume of methyl alcohol.

20. The process of claim 14 wherein said layer is exposed to actinic radiation having a wavelength of 365 nm to 436 nm at an energy level of about 150 to about 350 mj/cm2.

21. The process of claim 20 wherein said radiation is 436 nm and said energy level is about 250 to about 350 mj/cm2.

* * * * *